United States Patent

Konuma et al.

Patent Number: 5,427,887
Date of Patent: Jun. 27, 1995

[54] LIGHT-SENSITIVE COMPOSITION

[75] Inventors: Satoshi Konuma; Toshiyuki Matsumura, both of Hino; Akihisa Murata, Yokohama; Shigeo Tsuji, Machida, all of Japan

[73] Assignees: Konica Corporation; Mitsubishi Kasei Corporation, both of Tokyo, Japan

[21] Appl. No.: 106,699

[22] Filed: Aug. 16, 1993

[30] Foreign Application Priority Data

Aug. 17, 1992 [JP] Japan .................. 4-240019

[51] Int. Cl.⁶ .............................................. G03C 1/60
[52] U.S. Cl. ................... 430/175; 430/176; 430/302; 430/910; 430/157
[58] Field of Search .............. 430/176, 175, 302, 910, 430/157

[56] References Cited

U.S. PATENT DOCUMENTS

| | | | |
|---|---|---|---|
| 2,063,631 | 12/1936 | Schmidt et al. | 260/2 |
| 2,679,498 | 5/1954 | Seven et al. | 260/141 |
| 2,714,066 | 7/1955 | Jewett et al. | 95/8 |
| 2,946,683 | 7/1960 | Mellan et al. | 96/75 |
| 3,181,461 | 5/1965 | Fromson | 101/149.2 |
| 3,220,832 | 11/1965 | Uhlig | 96/1 |
| 3,930,865 | 1/1976 | Faust et al. | 430/260 |
| 4,123,276 | 10/1978 | Kita et al. | 430/176 |
| 4,172,729 | 10/1979 | Naritomi et al. | 430/171 |
| 4,179,292 | 12/1979 | Klupfel et al. | 430/175 |
| 4,275,138 | 6/1981 | Kita et al. | 430/157 |
| 4,304,832 | 12/1981 | Ohta et al. | 430/175 |
| 4,929,532 | 5/1990 | Dundes | 430/143 |
| 5,112,743 | 5/1992 | Kamiya et al. | 430/175 |

FOREIGN PATENT DOCUMENTS

| | | | |
|---|---|---|---|
| 0066452 | 12/1982 | European Pat. Off. | |
| 0130488 | 1/1985 | European Pat. Off. | |
| 0540016 | 5/1993 | European Pat. Off. | 430/176 |
| 2437408 | 2/1975 | Germany. | |
| 61-275838 | 12/1986 | Japan | 430/176 |
| 62-007045 | 1/1987 | Japan | 430/176 |
| 63-259657 | 10/1988 | Japan | 430/175 |

OTHER PUBLICATIONS

Derwent Abstract of 054281720 DE-A-2437408 (Feb. 1975).

Primary Examiner—Charles L. Bowers, Jr.
Assistant Examiner—John A. McPherson
Attorney, Agent, or Firm—Finnegan, Henderson, Farabow, Garrett & Dunner

[57] ABSTRACT

Disclosed is a light-sensitive composition which comprises (A) a diazo resin and (B) an alkali-soluble and swellable polymer compound, said polymer compound being a vinyl copolymer containing, as a constitutional unit, 0.1 to 10 mole % of a structure derived from an ester of acrylic acid or methacrylic acid having an alkyl group with 8 or more carbon atoms.

9 Claims, No Drawings

LIGHT-SENSITIVE COMPOSITION

BACKGROUND OF THE INVENTION

This invention relates to a light-sensitive composition, more specifically to a light-sensitive composition suitable for a negative type light-sensitive lithographic printing plate (PS plate).

In a binder resin for a negative type light-sensitive lithographic printing plate (PS plate), a reactive group and/or a polar group such as a COOH group, an alcoholic OH group, a phenolic OH group and a cyano group have been incorporated in order to improve sensitivity, press life, chemical resistance and developability. However, since these reactive group and polar group have generally hydrophilic property, it has been known that they prohibit ink from adhesion in printing. In order to prevent lowering in ink adhering property, an amount of the above reactive group and/or polar group should be generally as little as possible and also a monomer such as ethyl acrylate or ethyl methacrylate should be incorporated in the binder resin with a large amount (30 to 70 mole %).

However, when the monomer such as ethyl acrylate or ethyl methacrylate are used in a large amount, other troublesome problem arises that under developability, i.e. developability with a dilute developing solution (clearing property) is lowered. Thus, in order to satisfy both of ink adhering property and under developability, it is extremely important to optimize an amount of a monomer having the above reactive group and/or polar group and an amount of the monomer such as ethyl acrylate or ethyl methacrylate. However, it is practically extremely difficult to control the balance of these two kinds of monomers so that either ink adhering property or under developability is sacrificed.

SUMMARY OF THE INVENTION

An object of the present invention is to provide a light-sensitive composition suitable for a negative type light-sensitive lithographic printing plate (PS plate) which is excellent in ink adhering property and under developability without impairing sensitivity, press life and chemical resistance.

The present inventors have found that a vinyl series polymer containing 0.1 to 10 mole % of a structure derived from an ester of acrylic or methacrylic acid having an alkyl group with 8 or more carbon atoms is used as a constitutional unit of an alkali-soluble and swellable polymer compound which is to be used as a binder resin of a light-sensitive composition, a light-sensitive composition suitable for a negative type light-sensitive lithographic printing plate (PS plate) excellent in ink adhering property and under developability can be obtained without impairing sensitivity, press life and chemical resistance, whereby accomplished the present invention.

That is, the present invention is a light-sensitive composition which comprises (A) a diazo resin and (B) an alkali-soluble and swellable polymer compound, said polymer compound being a vinyl copolymer containing, as a constitutional unit, 0.1 to 10 mole % of a structure derived from an ester of acrylic acid or methacrylic acid having an alkyl group with 8 or more carbon atoms.

The present invention also relates to a light-sensitive composition wherein the polymer compound is a structure derived from a monomer having the structure of the following formula (2):

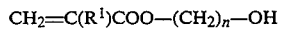

$$CH_2=C(R^1)COO-(CH_2)_n-OH$$

wherein $R^1$ represents a hydrogen atom or a methyl group and n represents an integer of 3 to 10.

The present invention further relates to a light-sensitive composition wherein the polymer compound is the structure derived from the above formula (2) and a structure derived from a monomer having the structure of the following formula (3):

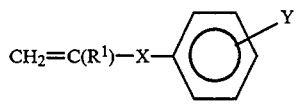

wherein $R^1$ represents a hydrogen atom or a methyl group, X represents —COO—, —CONH—, —OCO— or a single bond, Y represents —OH, —CN, —SO$_2$NH$_2$, —NHCOR$^2$, —O(CH$_2$)$_n$CN, —O(CH$_2$)$_n$OH, —(CH$_2$)OH or —(CH$_2$)$_n$CN, $R^2$ represents an alkyl group having 1 to 6 carbon atoms and n represents an integer of 2 to 5.

DESCRIPTION OF THE PREFERRED EMBODIMENTS

The diazo resin to be used in the light-sensitive composition of the present invention may be optional so long as it functions as a light-sensitive compound, and above all, a light-sensitive compound having the structure represented by the following formula (I) or (II) is preferably used.

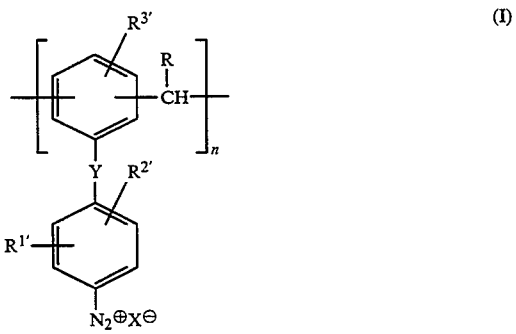

wherein R represents a hydrogen atom, an alkyl group or a phenyl group; $R^{1'}$, $R^{2'}$ and $R^{3'}$ each represent a hydrogen atom, an alkoxy group or an alkyl group; X represents a pair anion; and Y represents —O—, —S— or —NH—.

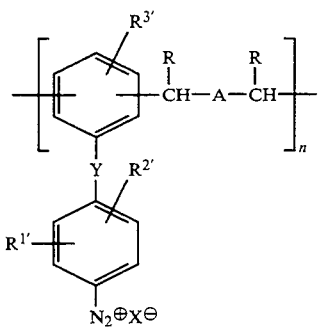

(II)

wherein R, R¹', R²', R³', X and Y have the same meanings as defined above, and A represents a fusable aromatic group.

In the above formula (II), specific examples of an aromatic compound which can be used for providing the aromatic group represented by A may include m-chlorobenzoic acid, diphenylacetic acid, phenoxyacetic acid, p-methoxyphenylacetic acid, p-methoxybenzoic acid, 2,4-dimethoxybenzoic acid, 2,4-dimethylbenzoic acid, p-phenoxybenzoic acid, 4-anilinobenzoic acid, 4-(m-methoxyanilino)benzoic acid, 4-(p-methylbenzoyl)benzoic acid, 4-(p-methylanilino)benzoic acid, phenol, (o, m, p)-cresol, xylenol, resorcin, 2-methylresorcin, (o, m, p)-methoxyphenol, m-ethoxyphenol, catechol, phloroglucin, p-hydroxyethylphenol, naphthol, pyrogallol, hydroquinone, p-hydroxybenzyl alcohol, 4-chlororesorcin, biphenyl-4,4'-diol, 1,2,4-benzenetriol, bisphenol A, 2,4-dihydroxybenzophenone, 2,3,4-trihydroxybenzophenone, p-hydroxyacetophenone, 4,4-dihydroxydiphenyl ether, 4,4'-dihydroxydiphenylamine, 4,4'-dihydroxydiphenylsulfide, cumylphenyl, (o, m, p)-chlorophenol, (o, m, p)-bromophenol, salicylic acid, p-hydroxybenzoic acid, 2-methyl-4-hydroxybenzoic acid, 6-methyl-4-hydroxybenzoic acid, 2,4-dihydroxybenzoic acid, 2,6-dihydroxybenzoic acid, 2,6-dihydroxy-4-benzoic acid, 4-chloro-2,6-dihydroxybenzoic acid, 4-methoxy-2,6-dihydroxybenzoic acid, gallic acid, phloroglucincarboxylic acid, p-hydroxyphenyl (meth)acrylamide, cinnamic acid, ethyl cinnamate, p-hydroxycinnamic acid, styrene, (o, p)-hydroxystyrene, stilbene, 4-hydroxystilbene, 4,4'-dihydroxystilbene, 4-carboxystilbene, 4,4'-dicarboxystilbene, diphenyl ether, diphenylamine, diphenylthio ether, 4-methoxydiphenyl ether, 4-methoxydiphenylamine and 4-methoxydiphenylthio ether.

Among them, particularly preferred are p-hydroxybenzoic acid, p-methoxybenzoic acid, p-hydroxycinnamic acid, p-hydroxyphenyl(meth)acrylamide, diphenyl ether, 4-methoxydiphenyl ether and diphenylamine.

As an aromatic diazonium compound which is a constitutional unit of the diazo resin represented by the above formulae (I) and (II), for example, the diazonium salt as described in Japanese Patent Publication No. 48001/1974 can be used, and the diphenylamine-4-diazonium salt group is particularly preferable. The diphenylamine-4-diazonium salt group is derived from a 4-amino-diphenylamine group. Such a 4-aminodiphenylamine group can include 4-amino-diphenylamine, 4-amino-3-methoxy-diphenylamine, 4-amino-2-methoxy-diphenylamine, 4'-amino-2-methoxy-diphenylamine, 4'-amino-4-methoxy-diphenylamine, 4-amino-3-methyldiphenylamine, 4-amino-3-ethoxy-diphenylamine, 4-amino-3-β-hydroxy-ethoxydiphenylamine, 4-amino-diphenylamine-2-sulfonic acid, 4-amino-diphenylamine-2-carboxylic acid and 4-amino-diphenylamine-2'-carboxylic, and particularly preferably can include 3-methoxy-4-amino-diphenylamine and 4-amino-diphenylamine.

The above diazo resin can be obtained according to the known method, for example, the method described in "Photographic Science and Engineering" (Photo. Sci. Eng.) vol. 17, page 33 (1973), U.S. Pat. No. 2,063,631, U.S. Pat. No. 2,679,498 and Japanese Patent Publication No. 48001/1974 by polycondensing an aromatic diazonium salt, an aromatic compound giving an aromatic group represented by A and an active carbonyl compound, for example, para-formaldehyde, acetoaldehyde, benzaldehyde or acetone and acetophenone in sulfuric acid, phosphoric acid or hydrochloric acid.

The aromatic compound giving the aromatic group represented by A in the formula (II), the aromatic diazo compound and the active carbonyl compound are freely combined, and further it is also possible to mix and condense two or more kinds of the above compounds.

The charge molar ratio of the aromatic compound giving the aromatic group represented by A and the aromatic diazonium compound is preferably 1:0.1 to 0.1:1, more preferably, 1:0.5 to 0.2:1, further preferably, 1:1 to 0.2:1. In this case, the aromatic compound giving the aromatic group represented by A, the aromatic diazonium compound and an aldehyde group or a ketone group are charged so that the molar ratio of the sum of the aromatic compound giving the aromatic group represented by A and the aromatic diazonium compound and an aldehyde group or a ketone group is usually preferably 1:0.6 to 1.2, more preferably, 1:0.7 to 1.5 and are reacted at a low temperature for a short time, for example, about 3 hours, thereby obtaining a diazo resin.

A pair anion of the above diazo resin forms stably a salt with the diazo resin and includes an anion which makes the resin soluble in an organic solvent. The compound forming such an anion may include an organic carboxylic acid such as decanoic acid and benzoic acid, an organic phosphoric acid such as phenyl phosphoric acid and sulfonic acid. As a typically exemplified compound, there may be included an aliphatic and aromatic sulfonic acid such as methane sulfonic acid, chloroethane sulfonic acid, dodecane sulfonic acid, benzene sulfonic acid, toluene sulfonic acid, mesitylene sulfonic acid, anthraquinone sulfonic acid, 2-hydroxy-4-methoxybenzophenone-5-sulfonic acid, hydroxy sulfonic acid, 4-acetylbenzene sulfonic acid and dimethyl-5-sulfo isophthalate, an aromatic compound containing a hydroxyl group such as 2,2',4,4'-tetrahydroxybenzophenone, 1,2,3-trihydroxybenzophenone and 2,2',4-trihydroxybenzophenone, a halogenated Lewis acid such as hexafluoro phosphoric acid and tetrafluoro boric acid, a perhalogenoic acid such as $ClO_4$ and $IO_4$. However, the pair anion is not limitative to the above compounds. Among them, particularly preferred are hexafluoro phosphoric acid and tetrafluoro boric acid.

In the present invention, the weight average molecular weight of the diazo resin used is not particularly limited, and for example, concerning the above copolycondensed diazo resin, the molecular weight can be obtained as an optional value by variously varying the molar ratio of each monomer and the condensing condition in the present invention, the diazo resin having the weight average molecular weight of about 400 to 10,000 can be used advantageously, and more preferably, the diazo resin having the molecular weight of about 800 to 5,000 is appropriate.

In the present invention, a high-molecular compound which is alkaline-soluble and swellable and is used a binder is a vinyl series copolymer which contains a structure derived from the ester of acrylic acid or methacrylic acid having an alkyl group with 8 or more carbon atoms as a constitutional unit. The ratio of the constitutional unit contained in the copolymer is 0.1 to 10 mol %, preferably, 0.3 to 5 mol %.

A monomer as a material of a constitutional unit derived from an ester of acrylic acid or methacrylic acid having an alkyl group of 8 or more carbon atoms enhances ink adhering property and water resistance due to the increase of the carbon number of the alkyl group of the monomer, in cases where a lithographic printing plate is prepared by using a copolymer synthesized by using the monomer in the light-sensitive composition. The carbon number of the alkyl chain of the monomer giving sufficiently the good property is 8 or more, preferably 10 to 18. Further, the alkyl chain of the monomer used in the present invention is not limitative to the alkyl group having the straight chain and may be the alkyl group having the side chain. The exemplified compound of the monomer may include n-octyl (meth)acrylate, n-nonyl (meth)acrylate, n-decyl (meth)acrylate, n-undecyl (meth)acrylate, n-dodecyl (meth)acrylate, n-tridecyl (meth)acrylate, n-tetradecyl (meth)acrylate, n-pentadecyl (meth)acrylate, n-hexadecyl (meth)acrylate, n-heptadecyl (meth)acrylate, n-octadecyl (meth)acrylate, 7-methyloctyl (meth)acrylate, 8-methylnonyl acrylate, 9-methyldecyl acrylate, 10-methylundecyl acrylate, 11-methyldodecyl acrylate, 12-methyltridecyl acrylate, 12-methyltridecyl acrylate, 13-methyltetradecyl acrylate, 14-methylpentadecyl acrylate, 6-methylheptyl acrylate, 6-methyloctyl acrylate, 7-methylnonyl acrylate, 8-methyldecyl acrylate, 9-methylundecyl acrylate, 10-methyldodecyl acrylate, 11-methyltridecyl acrylate, 12-methyltetradecyl acrylate, 13-methylpentadecyl acrylate, 6-ethyloctyl acrylate, 7-ethylnonyl acrylate, 8-ethyldecyl acrylate, 9-ethylundecyl acrylate, 10-ethyldodecyl acrylate, 11-ethyltridecyl acrylate and 12-ethyltetradecyl acrylate, however, is not limitative to the above compounds.

The copolymer suitably used in the present invention can be obtained by copolymerizing the addition polymerizable unsaturated compound with the monomer. As the addition polymerizable unsaturated compound, in addition to the compound represented by the formulae (2) and (3), there may be included, for example, the compound having an addition polymerizable unsaturated bond such as (meth)acrylic acid, a (meth)acryl amide group, a (meth)acrylic acid ester group, a vinyl ether group, a vinyl ketone group, a styrene group and an olefin group.

Among the polymerizable monomers which are the material of the copolymer suitably used in the present invention, in the compound represented by the formula (2), the ratio of the constitutional unit derived from the monomer contained in the copolymer is 1 to 80%, preferably 2 to 40%.

In the monomer represented by the formula (2), accompanying with the increase of the number of n, as the property of the copolymer, generally, resistance to wear is enhanced, modulas of elasticity is lowered and flexibility is enhanced as compared with the compound of which n is 2 or less (for example, n=2, $R_1$=CH$_3$, 2-hydroxyethyl methacrylate). Thus, when the copolymer is applied to the light-sensitive composition, the relaxation force to the stress is enhanced and the adhesion force to the support is enhanced accompanying with the increase of the number of n.

However, when the number of n is extremely large, a melting point is high and handling is inconvenient. According to the balance with other performances when the monomer is applied to the light-sensitive composition, the scope of n suitably used in the present invention is the integer of 3 to 6, more preferably 4. The exemplified compound of these monomers may include, for example, 4-hydroxybutyl (meth)acrylate, 5-hydroxypentyl (meth)acrylate and 6-hydroxyhexyl (meth)acrylate.

The above monomer can be easily obtained according to the known synthesis method. As a known publication, there may be included, for example, German Patent No. 1,518,572, Japanese Unexamined Patent Publication No. 83320/1975, Japanese Unexamined Patent Publication No. 37791/1988, German Patent No. 2,027,444 and British Patent No. 832,947.

Among the polymerizable monomer which is a material of the copolymer suitably used in the present invention, in the compound represented by the formula (3), the ratio of the monomer derived from the structure unit contained in the copolymer is 1 to 80%, preferably 2 to 40%.

The sensitivity, the press life, the chemical resistance and the developability of the nega type light-sensitive lithographic printing plate can be enhanced by using the copolymer having the structure unit derived from the monomer represented by the formula (3) in the light-sensitive composition. The exemplified compound of the monomer may include o-, m-, p-hydroxyphenyl (meth)acrylate, o-, m-, p-hydroxyphenyl (meth)acrylamide, vinyl o-, m-, p-hydroxybenzoate and isopropenyl o-, m-, p-hydroxybenzoate, preferably the compound having p-hydroxyphenyl group and a (meth)acrylamide group, more preferably p-hydroxyphenyl methacrylamide.

The exemplified compound of the other compounds having the addition polymerizable unsaturated bond which can be used in the present invention can include, for example, the following (1) to (9) compounds.

(1) (meth)acrylamides such as (meth)acrylamide, N-methylol (meth)acrylamide, N-ethyl acrylamide, N-hexyl acrylamide, N-cyclohexyl acrylamide, N-hydroxyethyl acrylamide, N-phenyl acrylamide, N-nitrophenyl acrylamide and N-ethyl-N-phenyl acrylamide (2) (substituted) alkyl (meth)acrylic acid esters such as methyl (meth)acrylate, ethyl (meth)acrylate, propyl (meth)acrylate, butyl (meth)acrylate, amyl (meth)acrylate, hexyl (meth)acrylate, octyl (meth)acrylate, acrylic acid-2-chloroethyl, (meth)acrylic acid-2-hydroxyethyl, glycidyl (meth)acrylate and cyclohexyl (meth)acrylate (3) vinyl ethers such as ethylvinyl ether, 2-chloroethylvinyl ether, hydroxyethylvinyl ether, propylvinyl ether, butylvinyl ether, octylvinyl ether and phenylvinyl ether (4) vinyl esters such as vinyl acetate, vinylchloro acetate, vinyl burylate and vinyl benzoate (5) styrenes such as styrone, α-methylstyrene, methylstyrene and chloromethylstyrene (6) vinyl ketones such as methylvinyl ketone, ethylvinyl ketone, propylvinyl ketone and phenylvinyl ketone (7) olefins such as ethylene, propylene, isobutylene, butadiene and isoprene (8) N-vinylpyrrolidone, N-vinylcarbazol, 4-vinylpyridine and (meth)acrylonitrile (9) unsaturated carboxylic acid such as (meth)acrylic acid, iraconic acid, crotonic acid and cinnamic acid In addition, if a compound can be copolymerized with (meth)acrylic acid ester having the alkyl group with 8 or more carbon atoms of the present invention, it can be used as a suitable addition polymerizable unsaturated compound of the present invention. The addition polymerizable unsaturated compound is not limitative to the above exemplified compounds.

Among them, the compound which is suitable as the addition polymerizable unsaturated compound constituting the copolymer with (meth)acrylic acid ester having the long chain alkyl group of 8 or more carbon number may include, in addition to the compounds represented by the formulae (2) and (3), methyl (meth)acrylate, ethyl (meth)acrylate, butyl acrylate, acrilonitrile and methacrylic acid.

The light-sensitive composition of the present invention can contain an acid and/or an acid anhydride.

In this case, the acid contained in the light-sensitive composition can be optionally selected from an optional organic acid or an inorganic acid. As the organic acid, an acid having at least one carboxyl group such as a monocarboxylic acid and a polycarboxylic acid is preferred. As the organic acid, there can be preferably used citric acid, oxalic acid, malic acid, tartaric acid and polyacrylic acid (which is sold in the market as a trademark, Julimer). As the inorganic acid, phosphoric acid can be used.

In cases where the acid anhydride is used, the kind of the acid anhydride is optional. The acid anhydride can include a compound derived from an aliphatic or an aromatic monocarboxylic acid such as acetic anhydride, propionic anhydride and benzoic anhydride and a compound derived from an aliphatic or an aromatic dicarboxylic acid such as succinic anhydride, maleic anhydride, glutaric anhydride, phthalic anhydride.

The dye of which the color is particularly changed to a colorless or is changed to other color can be incorporated into the light-sensitive composition of the present invention, preferably, the dye of which the color is changed to a colorless is incorporated into the light-sensitive composition.

The dye suitably used in the light-sensitive composition of the present invention may include the following compound.

That is, as the dye of which the color is changed to the colorless or is changed to other color, there may be included a triphenylmethane type, a diphenylmethane type, an oxazine type, a xanthene type, an iminonaphthoquinone type, an azomethine type or an anthraquinone type dye such as Victoria Pure Blue BOH (produced by Hodogaya Kagaku K.K.), Oil Blue #603 (produced by Orient Kagaku Kogyo K.K.), Patent Pure Blue (produced by Sumitomo Mikuni Kagaku K.K.), Crystal Violet, Brilliant Green, Ethyl Violet, Methyl Violet, Methyl Green, Erythrosine B, Basic Fuchsin, Malachite Green, Oil Red, m-Crezol Purple, Rhodamine B, Auramine, 4-p-Dimethylaminophenyl iminonaphthoquinone, Cyano-p-diethylaminophenyl acetoanilido.

Particularly preferably, the triphenylmethane type and the diphenylmethane type dye are advantageously used, and the triphenylmethane type dye is more preferable, particularly Victoria Pure Blue BOH is preferable.

The above discoloring agent is preferably contained usually in the amount of about 0.5 to about 10% by weight in the light-sensitive composition, more preferably in the amount of about 1 to 5% by weight.

Further, various additives can be added to the light-sensitive composition of the present invention.

As the additive, there can be included, for example, an alkyl ether group (e.g., ethyl cellulose and methyl cellulose) to improve a coating property, a fluorine surface active agent group, a non ion type surface active agent [e.g., Pluronic L-64 (produced by Asahi Denka K.K.)], a plasticizer (e.g., butyl phthalyl, polyethylene glycol, tributyl citrate, diethyl phthalate, dibutyl phthalate, dihexyl phthalate, dioctyl phthalate, tricrezyl phosphate, tributyl phosphate, trioctyl phosphate, tetrahydrofurfuryl oleate and an oligomer and polymer of acrylic acid or methacrylic acid) to give a flexibility and a resistance to wear of a coating film, an ink receptor (e.g., a half-esterified compound of styrene-maleic anhydride copolymer by alcohol described in Japanese Unexamined Patent Publication No. 527/1980) to further enhance an ink receptive of an image portion. The added amount of these additives is different due to the subject to be used and the object and generally preferably is 0.01 to 30% by weight based on the total solid content.

In order to obtain a light-sensitive lithographic printing plate from the light-sensitive composition of the present invention, for example, a determined amount of a diazo resin, the above high molecular compound as a binder and various additives (if necessary) is dissolved into an appropriate solvent (methyl cellosolve, ethyl cellosolve, methyl cellosolve acetate, acetone, methyl ethyl ketone, methanol, dimethylformamide, dimethyl sulfoxide, water or the mixture thereof) to prepare a coating liquid of the light-sensitive composition, and the coating liquid may be coated on a support and may be dried. It is desirable that the concentration of the light-sensitive composition is 1 to 50% by weight based on the total coating liquid when coated. In this case, the coated amount of the light-sensitive composition may be preferably about 0.2 to 10 g/m$^2$.

As the support on which the light-sensitive composition of the present invention is coated, various kinds of supports can be used. For example, there can be used an aluminum sheet (a grained aluminum sheet and the like), an iron sheet and a polyethylene terephthalate base paper on which an aluminum foil is adhered. Particularly the aluminum sheet is preferred.

However, when the aluminum sheet is used without the processing, there are the problems that the adhesiveness of the light-sensitive composition is bad and the light-sensitive composition is decomposed. In order to solve these problems, various proposals have been conventionally made.

For example, there are a method in which after the aluminum sheet is grained, it is processed with silicate (U.S. Pat. No. 2,714,066), a method in which it is processed with an organic salt (U.S. Pat. No. 2,714,066), a method in which it is processed with phosphonic acid and the derivative thereof (U.S. Pat. No. 3,220,832), a method in which it is processed with potassium hexafluorozirconate (U.S. Pat. No. 2,946,683), a method in which it is anodized and a method in which after it is anodized, it is processed with an aqueous solution of an alkali metal silicate (U.S. Pat. No. 3,181,461).

In the aluminum sheet (which includes an aluminum laminated sheet, hereinafter is same) suitably used as the support on which the light-sensitive composition of the present invention is coated, after the surface of the aluminum sheet is degreased, the graining is carried out by a brush abrading method, a ball abrading method, a chemical abrading method and an electrolytic etching method, preferably the graining is carried out by the electrolytic etching method, whereby a deep and uniform grain can be obtained. The anodizing processing is carried out by flowing a current supposing that the aluminum sheet is an anode, for example, in an aqueous solution of an inorganic salt of phosphoric acid, chromic acid, boric acid and sulfuric acid or an organic acid such as oxalic acid singly or in combination of two or more kinds thereof, preferably in an aqueous solution of sulfuric acid. The amount of anodized coated film is preferably 5 to 60 mg/dm$^2$, more preferably 5 to 30 mg/dm$^2$.

In practicing the present invention, in cases where the pore-sealing treatment is carried out, the light-sensitive lithographic printing plate is preferably dipped in an aqueous solution of sodium silicate having the concentration of 0.1 to 3% at the temperature of 80° to 95° C. for 10 seconds to 2 minutes, more preferably after the processing, is dipped in water at 40° to 95° C. for 10 seconds to 2 minutes.

The light-sensitive lithographic printing plate obtained by coating the light-sensitive composition of the present invention is sensitized and developed according to the conventional method. That is, for example, a negative leaf image against an original image can be obtained by sensitizing the printing plate through a transparent original image having a line image and a netlike image and then developing it by an aqueous developer. A suitable source to an exposure may include a carbon arc lamp, a mercury lamp, a xenon lamp, a metal halide lamp and a strobe light.

A developing method of the light-sensitive lithographic printing plate (hereinafter referred to (PS plate)) which is image-exposed is optional. For example, conventionally known various methods can be used.

As the developing method, there can be concretely used various methods such as a method in which the PS plate image-exposed is dipped in a developer, a method in which a developer is sprayed to the light-sensitive layer of the PS plate from a large number of nozzles, a method in which the light-sensitive layer of the PS plate is wiped with a sponge wetted with a developer and a method in which a developer is roller-coated on the surface of the light-sensitive layer of the PS plate. Further, after the developer is given to the light-sensitive layer of the PS plate as mentioned above, the surface of the light-sensitive layer can be lightly rubbed with a brush.

The developer for developing the light-sensitive lithographic printing plate obtained from the light-sensitive composition of the present invention is optional, if the developer is capable of developing the light-sensitive lithographic printing plate.

Preferably, the developer containing a specific organic solvent, an alkali agent and water as an indispensable component can be used. Here, the specific organic solvent is the one which dissolves or swells the non-exposed portion (non-image portion) of the light-sensitive layer, and preferably, of which the solubility to water at an ordinary temperature (20° C.) is 10% by weight or less. As such an organic solvent, there may be included the organic solvent having the above property, and it is not limitative to the following compounds, for example, a carboxylic acid ester such as ethyl acetate, propyl acetate, butyl acetate, amyl acetate, benzyl acetate, ethylene glycol monobutylacetate and butyl levulinate; a ketone group such as ethyl butylketone, methyl isobutyl ketone and cyclohexanone; an alcohol group such as ethylene glycol monobutyl ether, ethylene glycol benzyl ether, ethylene glycol monophenyl ether, benzyl alcohol, methyl phenyl carbinol, n-amyl alcohol and methyl amyl alcohol; an alkyl substituted aromatic hydrocarbon such as xylene; a halogenated hydrocarbon such as methylene dichloride, ethylene dichloride and monochloro benzene.

These organic solvents may be used singly or in combination of two or more kinds. Ethylene glycol monophenyl ether and benzyl alcohol are particularly advantageous. Further, the content of the organic solvents in the developer is preferably about 1 to 20% by weight, and the better results are obtained when the content is particularly 2 to 10% by weight.

On the other hand, as the preferable alkali agent contained in the developer, there may be included, (A) an inorganic alkali agent such as sodium silicate, potassium silicate, potassium hydroxide, sodium hydroxide, lithium hydroxide, sodium secondary or tertiary phosphate or an ammonium salt, sodium metasilicate and sodium carbonate or an ammonium;

(B) an organic amine compound such as mono-, di- or trimethylamine, mono- or diisopropylamine, n-butylamine, mono-, di- or triethanolamine, mono-, di- or triisopropanolamine, ethyleneimine and ethylenediamine.

The content of these alkali agents in the developer is preferably 0.05 to 4% by weight, more preferably 0.5 to 2% by weight.

In order to enhance the storability and the press life more highly, a water-soluble sulfite is preferably contained in the developer. As such a water-soluble sulfite, an alkali or alkali earth metal salt of sulfurous acid is preferable, there may be included, for example, sodium sulfite, potassium sulfite, lithium sulfite and magnesium sulfite. The content of these sulfites in the developer composition is usually preferably 0.05 to 4% by weight, more preferably 0.1 to 1% by weight.

When the developer is contacted with the light-sensitive lithographic printing plate after developed and exposed and the printing plate is rubbed with the developer, after 10 to 60 seconds at an about ordinary temperature to 40° C., the unexposed portion of the light-sensitive layer are perfectly removed without influencing badly to the exposed portion of the light-sensitive layer.

The developing condition can be appropriately selected due to the developing method. For example, in the developing method due to the dipping, the method in which the printing plate is dipped in the developer of about 10° to 40° C. for about 10 to 80 seconds can be used.

EXAMPLE

[Synthesis of copolymer 1]

The monomer mixture solution was prepared by using the monomer mixture of the monomer composition ratio (mol %) shown in Table 1 and the solution of methanol/acetone=1:1 so that the monomer concentration of the total monomer was 7.15%. To the mixture solution, 1.25 mol % equivalent of azobisisobutylonitrile based on the total monomer were added and the reflux was carried out under nitrogen stream at 65° C.

for 6 hours while stirring. After the completion of the reaction, 0.04% by weight of hydroquinone based on the total monomer were added to the reaction solution and the reaction solution was thrown to water to precipitate the copolymer. The precipitate was filtered and after the precipitate was dried at 60° C. for 3 days, 20% by weight methyl cellosolve solution of the copolymer were prepared by using methyl cellosolve.

[Synthesis of copolymers 2 to 9 and 10 to 14 (Comparative examples)]

Copolymers 2 to 9 and 10 to 14 were synthesized by using the monomer mixture of the monomer composition ratio (mol %) shown in Table 1 according to the similar method as mentioned above.

Synthesis of diazo resin 1

3.5 g (25 mmol) of p-hydroxybenzoic acid and 21.75 g (75 mmol) of p-diazodiphenylamine sulfate were dissolved into 90 g of conc. sulfuric acid under the ice cooling. 2.7 g (90 mmol) of p-formaldehyde were slowly added to the resulting solution. At the time, the addition was carried out so that the reaction temperature did not exceed 10° C. After the reaction solution was stirred for 2 hours, the solution was dropwise added to 1 liter of ethanol, the obtained precipitate was filtered and then was washed with ethanol. The precipitate was dissolved in 200 ml of pure water and an aqueous solution in which 10.5 g of zinc chloride was dissolved was added to the solution. The obtained precipitate was filtered and after the precipitate was washed with ethanol, it was dissolved in 300 ml of pure water. An aqueous solution in which 13.7 g of ammonium hexafluorophosphate were dissolved was added to the resulting solution. The obtained precipitate was filtered and after the precipitate was washed with water and ethanol, it was dried at 25° C. for one day to obtain diazo resin 1.

(Structure of aluminum sheet for lithographic printing plate)

An aluminum sheet was degreased with 3% aqueous solution of sodium hydroxide and was subjected to the electrolytic etching in 2% hydrochloric acid bath at a current density of 30 A/dm$^2$ at 25° C. After the aluminum sheet was washed with water, it was anodized in 30% sulfuric acid bath at 6.0 A/dm$^2$ at 30° C. for 2 minutes.

Then, after the aluminum sheet was processed with 1% sodium nitrite at 90° C. for 10 seconds, it was subjected to a pore-sealing treatment by using 1% aqueous solution of sodium metasilicate at 85° C. for 30 seconds. Then, it was washed with water and dried to obtain an aluminum sheet for a light-sensitive lithographic printing plate.

On the aluminum sheet prepared according to the above method, the light-sensitive solution (a methyl cellosolve solution of which the solid content concentration is 10% by weight) having the composition shown in the formulation was coated with a wire bar so than the weight of the coated film after dried was 20 mg/dm$^2$.

Examples 1 to 28 and Comparative Examples 29 to 38 (copolymers 1 to 28 and 29 to 38)

| Formulation | |
|---|---|
| Copolymer (20% methyl cellosolve solution) | 100 parts |
| Diazo resin | 10 parts |
| Julimer AC-10L (5% methyl cellosolve solution) | 6 parts |
| Victoria Pure Blue BOH | 2 parts |
| Dye (KAYASET ORANGE AN) | 1 part |
| Solid content of light-sensitive solution | 10% by weight |

Evaluation condition

Exposing amount: corresponding to Kodak step tablet-over-all 4 steps

Light source: 4 kw metal halide lamp, distance: 60 cm

Development: SDN-21 developer (4 fold dilution, 4 fold dilution and 8 fold dilution of only developability), 25° C., 40 seconds Gum: after developed, Konica gum solution SGW-2 was coated with a sponge Each sample thus obtained was printed with a means of "Heiderberg GTO" printer. The press life with an alkaline dampening water used in the printing of the news paper, the gum-removed numbers of sheets and the stain of the non-image portion as an alkali water under developability were evaluated, respectively, when developed with 4 fold and 8 fold dilution of the SDN-21 developing solution.

These results are shown in Table 2.

In the light-sensitive lithographic printing plate, the excellent press life means that the mechanical property and the adhesion to the support of the light-sensitive composition is excellent.

The small numbers of sheets gum-removed shows that the ink adhering property is excellent.

Developability well: the state where the stain is not at all generated in the non-image portion bad: the state where the stain is generated in the non-image portion O: the stain is not at all generated OΔ: intermediate level Δ: the stain is partially generated X: the stain is generated on the whole surface Press life high: press number of a hundred thousands or more intermediate: 60 thousands or more to less than a hundred thousands low: less than 60 thousands

| | | | | | *1 | | | | | |
|---|---|---|---|---|---|---|---|---|---|---|
| No. | HyPMA | HyPMAc | HyPAc | VHBA | EA | MA | EMA | AN | MAA | HEMA |
| Example | | | | | | | | | | |
| 1 | 10 | | | | 39 | 15 | | 24 | 10 | |
| 2 | 10 | | | | 39 | 15 | | 24 | 10 | |
| 3 | | 10 | | | 39 | 15 | | 24 | 10 | |
| 4 | | | 10 | | 39 | 15 | | 24 | 10 | |
| 5 | | | | 10 | 39 | 15 | | 24 | 10 | |
| 6 | 10 | | | | 39 | 15 | | 24 | 10 | |
| 7 | 10 | | | | 39 | 15 | | 24 | 10 | |

-continued

| No. | | | | | | | | | |
|---|---|---|---|---|---|---|---|---|---|
| 8 | 10 | | | | 39 | 15 | | 24 | 10 |
| 9 | 10 | | | | 40.7 | 15 | | 24 | 10 |
| 10 | 10 | | | | 36 | 15 | | 24 | 10 |
| 11 | 10 | | | | 33 | 15 | | 24 | 10 |
| 12 | | | | | 33 | 14 | 14 | 25 | 8 | 5 |
| 13 | | | | | 33 | 14 | 14 | 25 | 8 |
| 14 | | | | | 33 | 14 | 14 | 25 | 8 |
| 15 | | | | | 33 | 14 | 14 | 25 | 8 |
| 16 | 8 | | | | 30 | 12 | | 28 | 10 |
| 17 | 8 | | | | 30 | 13 | | 28 | 10 |
| 18 | 8 | | | | 30 | 13 | | 28 | 10 |
| 19 | 8 | | | | 30 | 13 | | 28 | 10 |
| 20 | | 8 | | | 30 | 13 | | 28 | 10 |
| 21 | | | 8 | | 30 | 13 | | 28 | 10 |
| 22 | | | | 8 | 30 | 13 | | 28 | 10 |
| 23 | 30 | | | | 25 | 10 | | 20 | 7 |
| 24 | 8 | | | | 34 | 12 | | 30 | 10 |
| 25 | 8 | | | | 34 | 12 | | 30 | 10 |
| 26 | 8 | | | | 30 | 13 | | 28 | 10 |
| 27 | 8 | | | | 30 | 13 | | 28 | 10 |
| 28 | 7 | | | | 25 | 10 | | 20 | 7 |
| Comp. Example | | | | | | | | | |
| 29 | 10 | | | | 41 | 15 | | 24 | 10 |
| 30 | 10 | | | | 32 | 15 | | 21 | 10 |
| 31 | 10 | | | | 39 | 15 | | 24 | 10 |
| 32 | 8 | | | | 30 | 12 | | 28 | 10 |
| 33 | | | | | 34 | 14 | 14 | 25 | 8 | 5 |
| 34 | | | | | 34 | 14 | 14 | 25 | 8 |
| 35 | 8 | | | | 31 | 13 | | 28 | 10 |
| 36 | 8 | | | | 34 | 13 | | 30 | 10 |
| 37 | 8 | | | | 31 | 13 | | 28 | 10 |
| 38 | 8 | | | | 31 | 13 | | 28 | 10 |

| | | | | | *1 | | | | |
|---|---|---|---|---|---|---|---|---|---|
| No. | 4HBA | 4HBMA | 8HOA | HA | IOA | LA | SA | LMA | SMA |
| Example | | | | | | | | | |
| 1 | | | | | 2 | | | | |
| 2 | | | | | | 2 | | | |
| 3 | | | | | | 2 | | | |
| 4 | | | | | | 2 | | | |
| 5 | | | | | | 2 | | | |
| 6 | | | | | | | 2 | | |
| 7 | | | | | | | | 2 | |
| 8 | | | | | | | | | 2 |
| 9 | | | | | | 0.3 | | | |
| 10 | | | | | | 5 | | | |
| 11 | | | | | | 8 | | | |
| 12 | | | | | | 1 | | | |
| 13 | 5 | | | | | 1 | | | |
| 14 | | 5 | | | | 1 | | | |
| 15 | | | 5 | | | 1 | | | |
| 16 | 10 | | | | 2 | | | | |
| 17 | 10 | | | | | 1 | | | |
| 18 | 10 | | | | | | | 1 | |
| 19 | 10 | | | | | | | | 1 |
| 20 | 10 | | | | | 1 | | | |
| 21 | 10 | | | | | 1 | | | |
| 22 | 10 | | | | | 1 | | | |
| 23 | 7 | | | | | 1 | | | |
| 24 | 5 | | | | | 1 | | | |
| 25 | 5 | | | | | | 1 | | |
| 26 | | 10 | | | | 1 | | | |
| 27 | | | 10 | | | 1 | | | |
| 28 | 30 | | | | | 1 | | | |
| Comp. Example | | | | | | | | | |
| 29 | | | | | | | | | |
| 30 | | | | | | 12 | | | |
| 31 | | | | 2 | | | | | |
| 32 | 10 | | | | 2 | | | | |
| 33 | | | | | | | | | |
| 34 | 5 | | | | | | | | |
| 35 | 10 | | | | | | | | |
| 36 | 5 | | | | | | | | |
| 37 | | 10 | | | | | | | |

-continued

| | 38 | 10 |
|---|---|---|

*1: Monomer
HyPMA: 4-hydroxyphenyl methacrylamide
HyPMAc: Methacrylic acid-4-hydroxyphenyl (4-hydroxyphenyl methacrylate)
HyPAc: Acrylic acid-4-hydroxyphenyl (4-hydroxyphenyl acrylate)
VHBA: vinyl 4-hydroxybenzoate
EA: Ethyl acrylate
MA: Methyl acrylate
EMA: Ethyl methacrylate
AN: Acrilonitrile
MAA: Methacrylic acid
HEMA: Methacrylic acid-2-hydroxyethyl (2-hydroxyethyl methacrylate)
4HBA: Acrylic acid-4-hydroxybutyl (4-hydroxybutyl acrylate)
4HBMA: Methacrylic acid-4-hydroxybutyl (4-hydroxybutyl methacrylate)
8HOA: Acrylic acid-8-hydroxyoctyl (8-hydroxyoctyl acrylate)
HA: Hexyl acrylate
IOA: Acrylic acid-6-methylheptyl (6-methylheptyl acrylate)
LA: Dodecyl acrylate
SA: Octadecyl acrylate
LMA: Dodecyl methacrylate
SMA: Octadecyl methacrylate

TABLE 2

| No. | Developability 4 fold dilution | Developability 8 fold dilution | Gum removed (sheet) | Press life (sheet) |
|---|---|---|---|---|
| 1 | ○ | ○ | 9 | 80.000 |
| 2 | ○ | ○ | 8 | 70.000 |
| 3 | ○ | ○△ | 8 | 80.000 |
| 4 | ○ | ○ | 7 | 70.000 |
| 5 | ○ | ○ | 7 | 70.000 |
| 6 | ○ | ○ | 5 | 70.000 |
| 7 | ○ | ○ | 6 | 70.000 |
| 8 | ○ | ○ | 5 | 70.000 |
| 9 | ○ | ○ | 13 | 70.000 |
| 10 | ○ | ○△ | 5 | 80.000 |
| 11 | ○ | △ | 4 | 80.000 |
| 12 | ○ | △ | 7 | 60.000 |
| 13 | ○ | △ | 7 | 110.000 |
| 14 | ○ | △ | 7 | 120.000 |
| 15 | ○ | △ | 7 | 140.000 |
| 16 | ○ | ○ | 9 | 180.000 |
| 17 | ○ | ○ | 7 | 180.000 |
| 18 | ○ | ○ | 6 | 180.000 |
| 19 | ○ | ○ | 5 | 180.000 |
| 20 | ○ | ○△ | 6 | 190.000 |
| 21 | ○ | ○ | 6 | 170.000 |
| 22 | ○ | ○ | 6 | 170.000 |
| 23 | ○ | △ | 8 | 240.000 |
| 24 | ○ | ○ | 7 | 130.000 |
| 25 | ○ | ○ | 5 | 120.000 |
| 26 | ○ | ○ | 6 | 190.000 |
| 27 | ○ | ○△ | 6 | 200.000 |
| 28 | ○ | △ | 6 | 220.000 |
| 29 | ○ | ○ | >40 | 80.000 |
| 30 | ○ | X | — | — |
| 31 | ○ | ○ | 22 | 80.000 |
| 32 | ○ | ○ | 24 | 180.000 |
| 33 | ○ | △ | 37 | 60.000 |
| 34 | ○ | △ | 33 | 110.000 |
| 35 | ○ | ○ | 28 | 180.000 |
| 36 | ○ | ○ | 32 | 130.000 |
| 37 | ○ | ○ | 36 | 190.000 |
| 38 | ○ | ○△ | 32 | 200.000 |

As explained in detail above, according to the light-sensitive composition of the present invention, it can be understood that the excellent ink adhering property can be obtained without impairing the developability and the press life.

We claim:

1. A light-sensitive composition which comprises
(A) a diazo resin and
(B) an alkali-soluble and swellable polymer compound, said polymer compound being a vinyl copolymer containing, as a constitutional unit, 0.1 to 10 mole % of a structure derived from an ester of acrylic acid or methacrylic acid having an alkyl group with 8 or more carbon atoms, and wherein said polymer compound has a structure derived from a monomer having the structure of the following formula (2):

wherein $R^1$ represents a hydrogen atom or a methyl group and n represents an integer of 3 to 10.

2. The composition of claim 1, wherein said polymer compound has the structure derived from the above formula (2) and a structure derived from a monomer having the structure of the following formula (3):

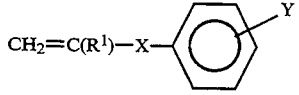

wherein $R^1$ represents a hydrogen atom or a methyl group, X represents —COO—, —CONH—, —OCO— or a single bond, Y represents —OH, —CN, —SO$_2$NH$_2$, —NHCOR$^2$, —O(CH$_2$)$_n$CN, —O(CH$_2$)$_n$OH, —(CH$_2$)OH or —(CH$_2$)$_n$CN, $R^2$ represents an alkyl group having 1 to 6 carbon atoms and n represents an integer of 2 to 5.

3. The composition of claim 1, wherein said polymer compound having a constitutional unit of a structure derived from an ester of acrylic acid or methacrylic acid having an alkyl group with 8 or more carbon atoms is contained in an amount of 0.3 to 5 mol % in the copolymer.

4. The composition of claim 1, wherein a weight average molecular weight of said diazo resin is about 400 to 10,000.

5. The composition of claim 1, wherein the weight average molecular weight of said diazo resin is about 800 to 5,000.

6. The composition of claim 2, wherein the number of n in the Formula (2) is an integer of 3 to 6.

7. The composition of claim 2, wherein the number of n in the Formula (2) is 4.

8. The composition of claim 2, wherein the ratio of the polymerizable monomer represented by the Formula (3) contained in the copolymer is 1 to 80%.

9. The composition of claim 2, wherein the ratio of the polymerizable monomer represented by the Formula (3) contained in the copolymer is 2 to 40%.

* * * * *